(12) United States Patent
Iikubo

(10) Patent No.: US 7,830,663 B2
(45) Date of Patent: Nov. 9, 2010

(54) ELECTRONIC DEVICE

(75) Inventor: Takashi Iikubo, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/645,188

(22) Filed: Dec. 22, 2009

(65) Prior Publication Data

US 2010/0097764 A1    Apr. 22, 2010

Related U.S. Application Data

(63) Continuation of application No. 11/873,768, filed on Oct. 17, 2007, now Pat. No. 7,660,119.

(30) Foreign Application Priority Data

Nov. 30, 2006    (JP)    .............................. 2006-324800

(51) Int. Cl.
*H05K 7/20*    (2006.01)
(52) U.S. Cl. .................. 361/697; 361/679.47; 361/695; 361/679.49; 165/104.33; 165/104.34
(58) Field of Classification Search ............ 361/679.46, 361/679.47, 479.49, 690–697, 700, 701, 361/704, 715, 719; 165/80.2, 80.3, 80.4, 165/80.5, 104.33, 104.34, 185, 119, 121, 165/122; 174/15.1, 16.3, 252; 257/706–727, 257/E23.088, E23.099; 454/184
See application file for complete search history.

(56) References Cited

U.S. PATENT DOCUMENTS

| | | | | |
|---|---|---|---|---|
| 6,262,883 B1* | 7/2001 | Kim | ....................... | 361/679.09 |
| 6,304,441 B1* | 10/2001 | Han | ....................... | 361/679.48 |
| 6,442,024 B1 | 8/2002 | Shih | | |
| 6,657,269 B2* | 12/2003 | Migliorato et al. | .......... | 257/414 |
| 6,657,860 B2 | 12/2003 | Matsui et al. | | |
| 7,209,352 B2 | 4/2007 | Chen | | |
| 7,342,786 B2 | 3/2008 | Malone et al. | | |
| 7,466,548 B2 | 12/2008 | Ishikawa | | |
| 2002/0134531 A1 | 9/2002 | Yanagida | | |
| 2004/0001316 A1* | 1/2004 | Kamikawa et al. | .......... | 361/700 |

(Continued)

FOREIGN PATENT DOCUMENTS

CN    2755779    2/2006

(Continued)

OTHER PUBLICATIONS

An English Translation of Office Action for Chinese Patent Application No. 2007101682351 mailed by Chinese Patent Office on Aug. 7, 2009.

*Primary Examiner*—Michael V Datskovskiy
(74) *Attorney, Agent, or Firm*—Knobbe Martens Olson & Bear, LLP

(57) ABSTRACT

According to one embodiment, an electronic device includes a cooling fan which is arranged in a case, a space being present between heat radiation fins and the cooling fan, and a case-contained member contained in the case. The case includes a second member which is detachably coupled to a first member and faces the space. The case-contained member faces the space on the side opposite to the second member. When the second member is coupled to the first member, the second member and the case-contained member cooperate to form a duct which guides air exhausted from the cooling fan to the heat radiation fins.

8 Claims, 14 Drawing Sheets

U.S. PATENT DOCUMENTS

| | | |
|---|---|---|
| 2006/0039113 A1* | 2/2006 | Cheng et al. .................. 361/700 |
| 2006/0181851 A1* | 8/2006 | Frank et al. .................. 361/700 |
| 2007/0131383 A1 | 6/2007 | Hattori et al. |
| 2007/0146988 A1 | 6/2007 | Yamagishi et al. |

FOREIGN PATENT DOCUMENTS

| | | |
|---|---|---|
| JP | 2-85621 | 3/1990 |
| JP | 2-301192 | 12/1990 |
| JP | 2005-321287 | 11/2005 |

* cited by examiner

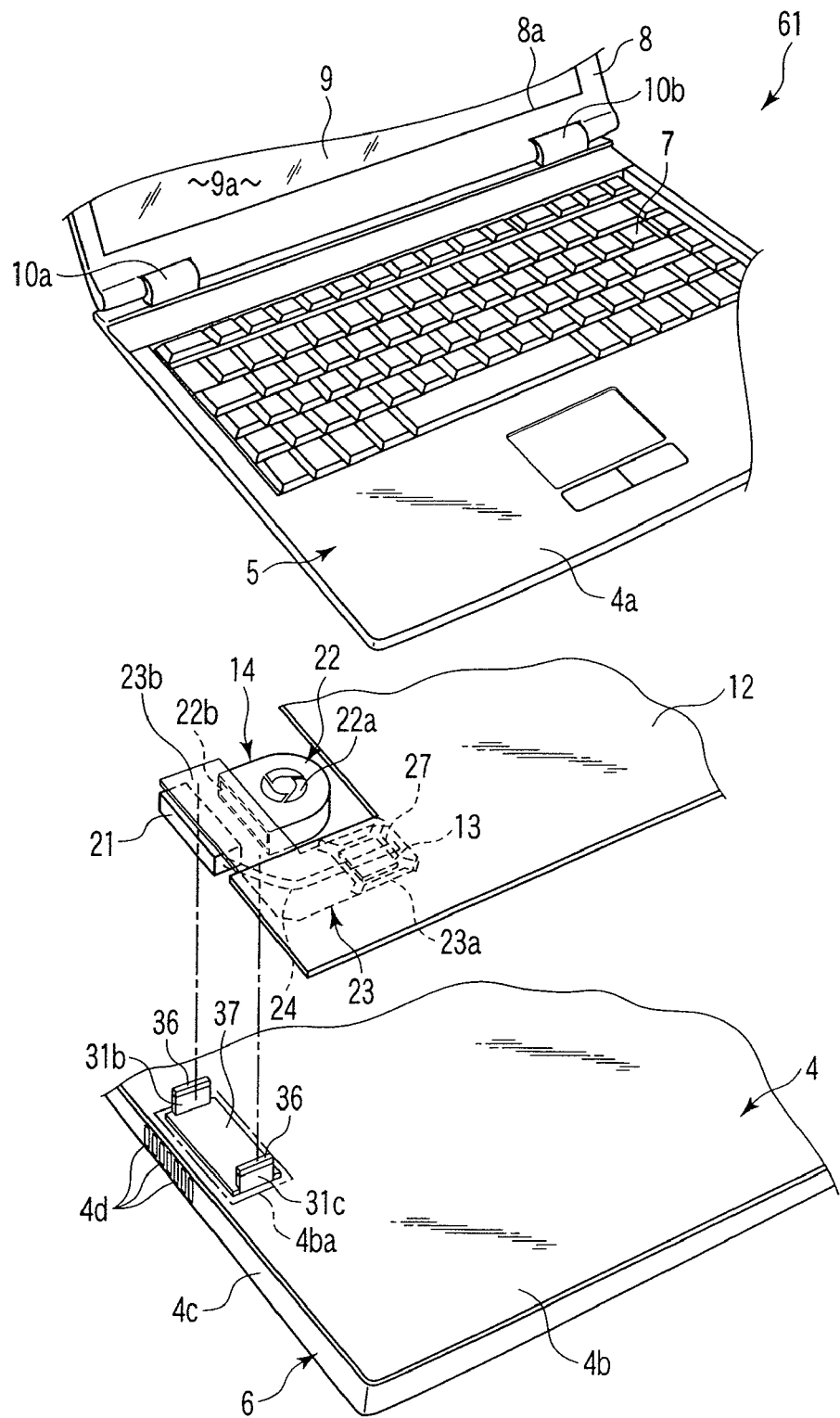
F I G. 9

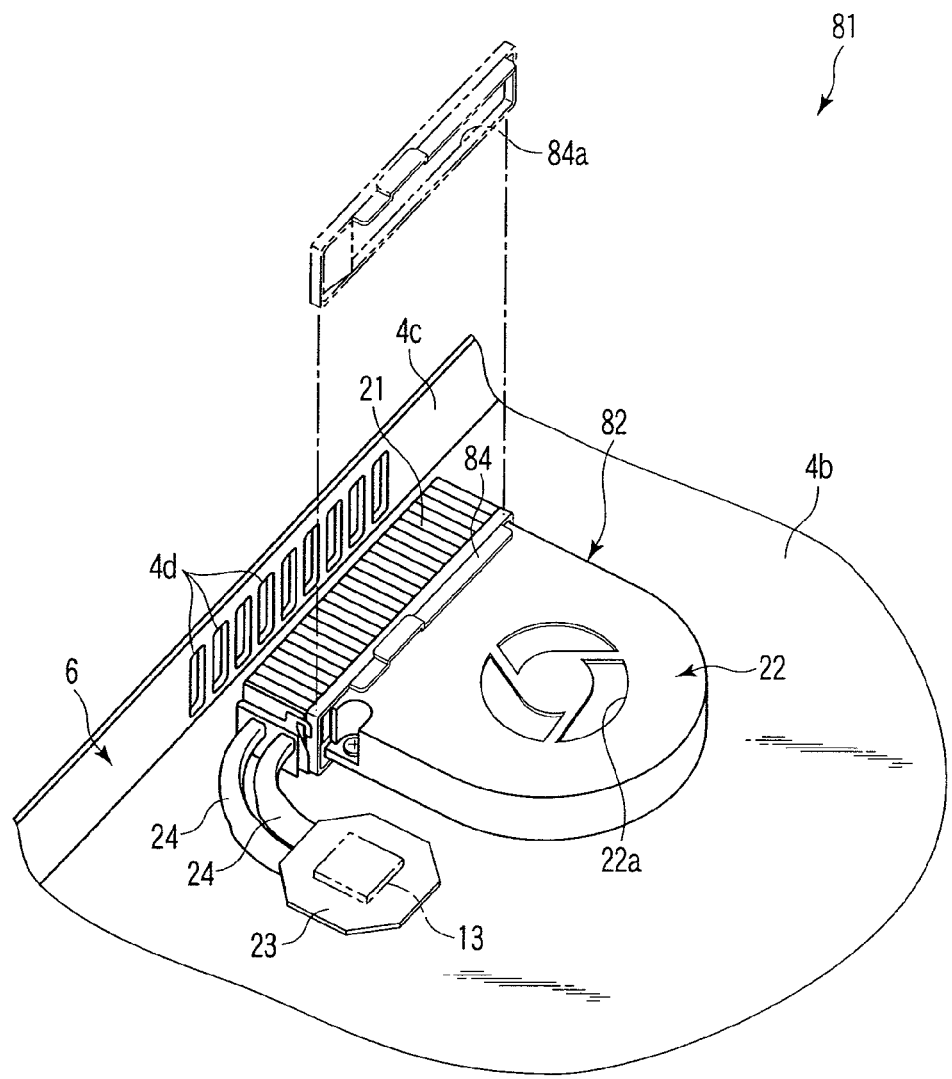
F I G. 13
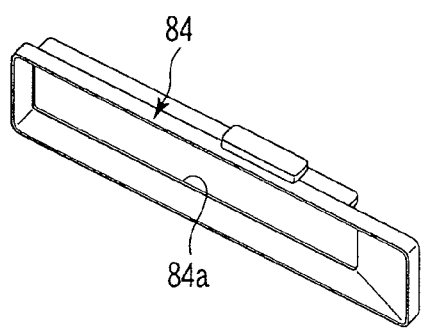
F I G. 14

ELECTRONIC DEVICE

CROSS-REFERENCE TO RELATED APPLICATIONS

This application is a continuation of U.S. patent application Ser. No. 11/873,768, filed Oct. 17, 2007, and entitled "ELECTRONIC DEVICE," which is based upon and claims the benefit of priority from Japanese Patent Application No. 2006-324800, filed Nov. 30, 2006, the entire contents of both of which are incorporated herein by reference.

BACKGROUND

1. Field

One embodiment of the invention relates to an electronic device equipped with heat radiation fins and a fan.

2. Description of the Related Art

An electronic device such as a portable computer is frequently provided with a heat radiation structure including heat radiation fins and a cooling fan. When the electronic device provided with such a heat radiation structure is used for a long time, dust will be deposited on the heat radiation fins. The dust deposited on the heat radiation fins reduces an efficiency of the cooling by the cooling fan.

Jpn. Pat. Appln. KOKAI Publication No. 2-301192 discloses a control board for an elevator, which is capable of cleaning dust deposited on heat radiation fins. In the control board, the heat radiation fins are located in a cooling air passage, and an inspection window is formed in a part of a case at a position facing the heat radiation fins. The inspection window is covered with a covering member, which may be opened and closed.

A place of the heat radiation fins where dust tends to deposit are the side face of the heat radiation fins facing the cooling fan. In the case of the control board, the heat radiation fins and the cooling fan are closely arranged with each other. It is therefor impossible to clean the side face of the heat radiation fins facing the cooling fan. If a window and a space for the cleaning purpose are provided around the heat radiation fins, air flowing from the cooling fan to the heat radiation fins leaks to flow in untended directions. This results in decreasing the efficiency of the cooling of the heat radiation fins by the cooling fan.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 9 is an exemplary exploded perspective view showing a portable computer according to a fourth embodiment of the invention;

FIG. 13 is an exemplary perspective view showing a heat radiation unit according to the sixth embodiment;

FIG. 14 is an exemplary perspective view showing a duct member according to the sixth embodiment;

DETAILED DESCRIPTION

Various embodiments according to the invention will be described hereinafter with reference to the accompanying drawings. In general, according to one embodiment of the invention, an electronic device comprises: a case; heat radiation fins contained in the case; a cooling fan which exhausts air toward the heat radiation fins, the cooling fan being arranged in the case and facing the heat radiation fins, and a space being present between the cooling fan and the heat radiation fins; and a case-contained member contained in the case. The case includes a first member and a second member which is detachably coupled to the first member and faces the space. The case-contained member faces the space on the side opposite to the second member. When the second member of the case is coupled to the first member, the second member and the case-contained member cooperate to form a duct which guides air exhausted from the cooling fan to the heat radiation fins.

Embodiments of the present invention will be described with reference to the accompanying drawings. In those embodiments, the present invention is applied to a portable computer.

Figure 1:
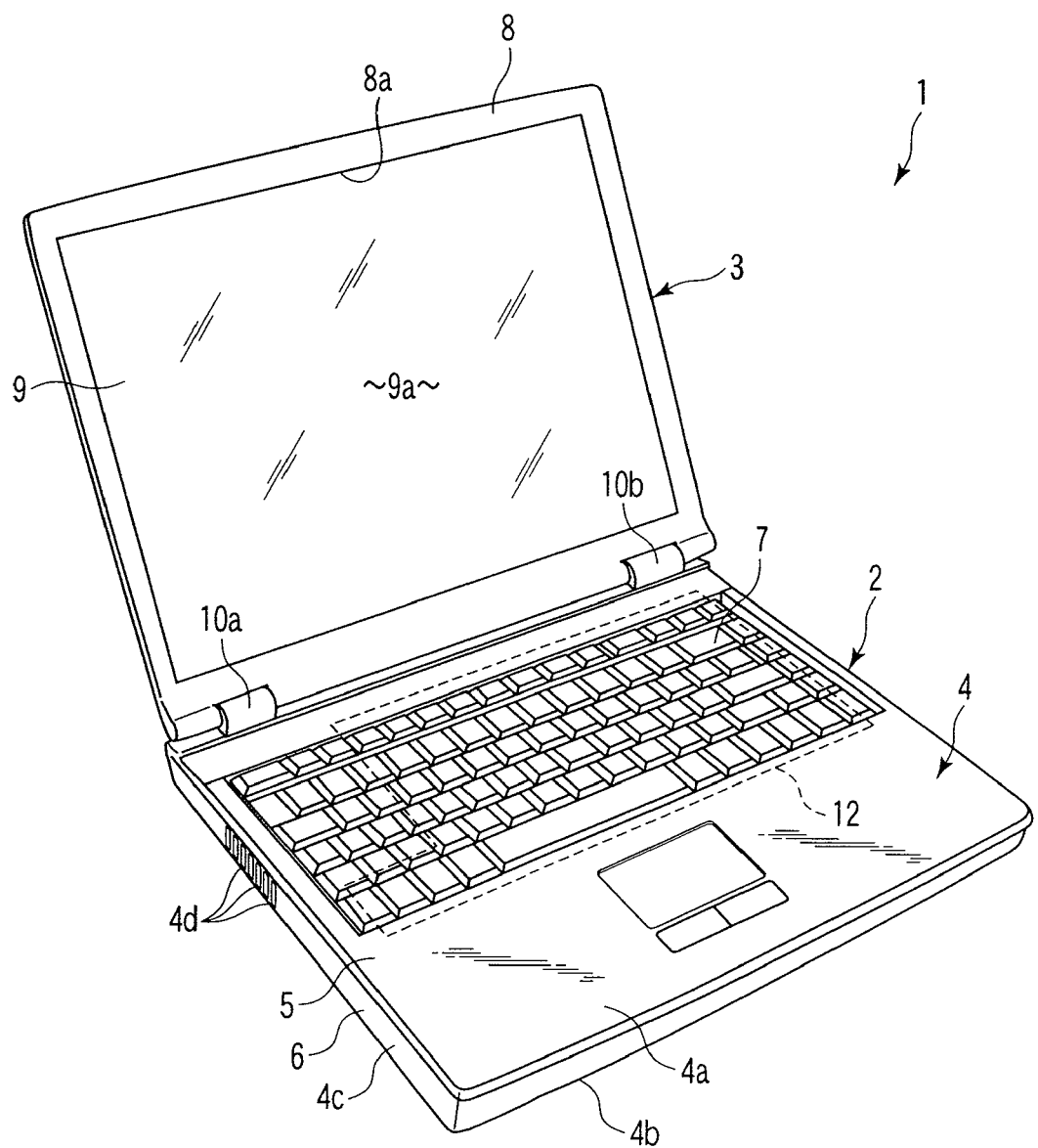
FIG. 1 is an exemplary perspective view showing a portable computer according to a first embodiment of the present invention.

FIGS. 1 to 6 show a portable computer 1 as an electronic device according to a first embodiment of the invention. As shown in FIG. 1, the portable computer 1 is provided with a main body 2 and a display unit 3.

The main body 2 is provided with a case 4 shaped like a box. The case 4 has an upper wall 4a, a lower wall 4b and a peripheral wall 4c. The case 4 is provided with a case cover 5 including the upper wall 4a and a case base 6 including the lower wall 4b. The case cover 5 is detachably coupled to the case base 6 and supported on the case base 6. The upper wall 4a supports a keyboard 7. Exhaust holes 4d are formed in the peripheral wall 4c.

The display unit 3 includes a display housing 8 and a liquid crystal display (LCD) module 9 contained in the display housing 8. The LCD module 9 includes a display screen 9a. The display screen 9a is exposed to the outside of the display housing 8 through an opening 8a on the front of the display housing 8.

The display unit 3 is supported on the rear end of the case 4 through a pair of hinge parts 10a, 10b. Accordingly, the display unit 3 is rotatable between a closed position where it is laid down so as to cover the upper wall 4a from above and an open position where it is raised so as to expose the upper wall 4a.

Figure 4:
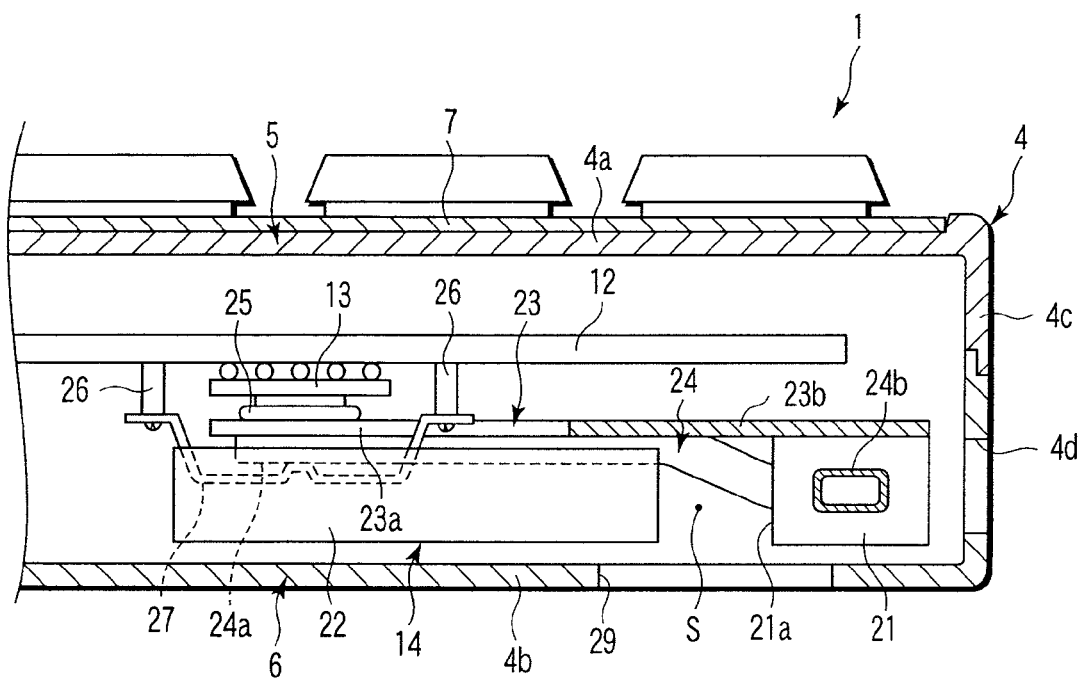
FIG. 4 is an exemplary cross-sectional view showing a state of the portable computer according to the first embodiment when a lid member is removed.

As shown in FIG. 1, a circuit board 12 is contained in the case 4. As shown in FIG. 4, a heat generating component 13 is mounted on the circuit board 12. The heat generating component 13 is a circuit component which generates heat when it is operating. An example of the circuit component 13 is a CPU, a north-bridge (trademark), a memory, a graphics chip, a graphics controller, or a power source circuit. The heat generating component as used herein involves every type of electronic component which needs heat radiation therefrom.

The case 4 contains a heat radiation unit 14 for promoting heat radiation from the heat generating component 13. The heat radiation unit 14 includes heat radiation fins 21, a cooling fan 22, a heat receiving member 23, and a heat transfer member 24. The heat radiation fins 21 are arranged close to the inner peripheral edge of the case 4 having the exhaust holes 4d, and facing the exhaust holes 4d. The cooling fan 22 is arranged facing the heat radiation fins 21. The cooling fan 22 includes a suction port 22a opened in the case 4 and an exhaust port 22b facing the heat radiation fins 21. The cooling fan 22 sucks air through the suction port 22a and exhausts the sucked air toward the heat radiation fins 21 through the exhaust port 22b.

As shown in FIG. 4, the cooling fan 22 is arranged with a space S formed between the cooling fan and the heat radiation fins 21. Dust tends to deposit on the surface 21a of the heat radiation fins 21, which is confronted with the cooling fan 22. The cooling fan 22 is separated from the heat radiation fins 21 by a predetermined distance to form the space S between the cooling fan 22 and the heat radiation fins 21. The space S may be used for the cleaning of the surface 21a of the heat radiation fins 21.

The heat receiving member 23 faces the heat generating component 13. The heat receiving member 23 may be a heat receiving block or a heat receiving sheet metal, for example. The heat receiving member 23 is made of sheet metal, for example, and has high heat conductivity. The heat receiving member 23 receives heat generated from the heat generating component 13 and transfers the heat to the heat transfer member 24. A heat conductive member 25 is interposed between the heat receiving member 23 and the heat generating component 13. The heat conductive member 25 may be a heat conductive sheet or grease, and enhances the heat conduction between the heat generating component 13 and the heat receiving member 23.

Figure 3:
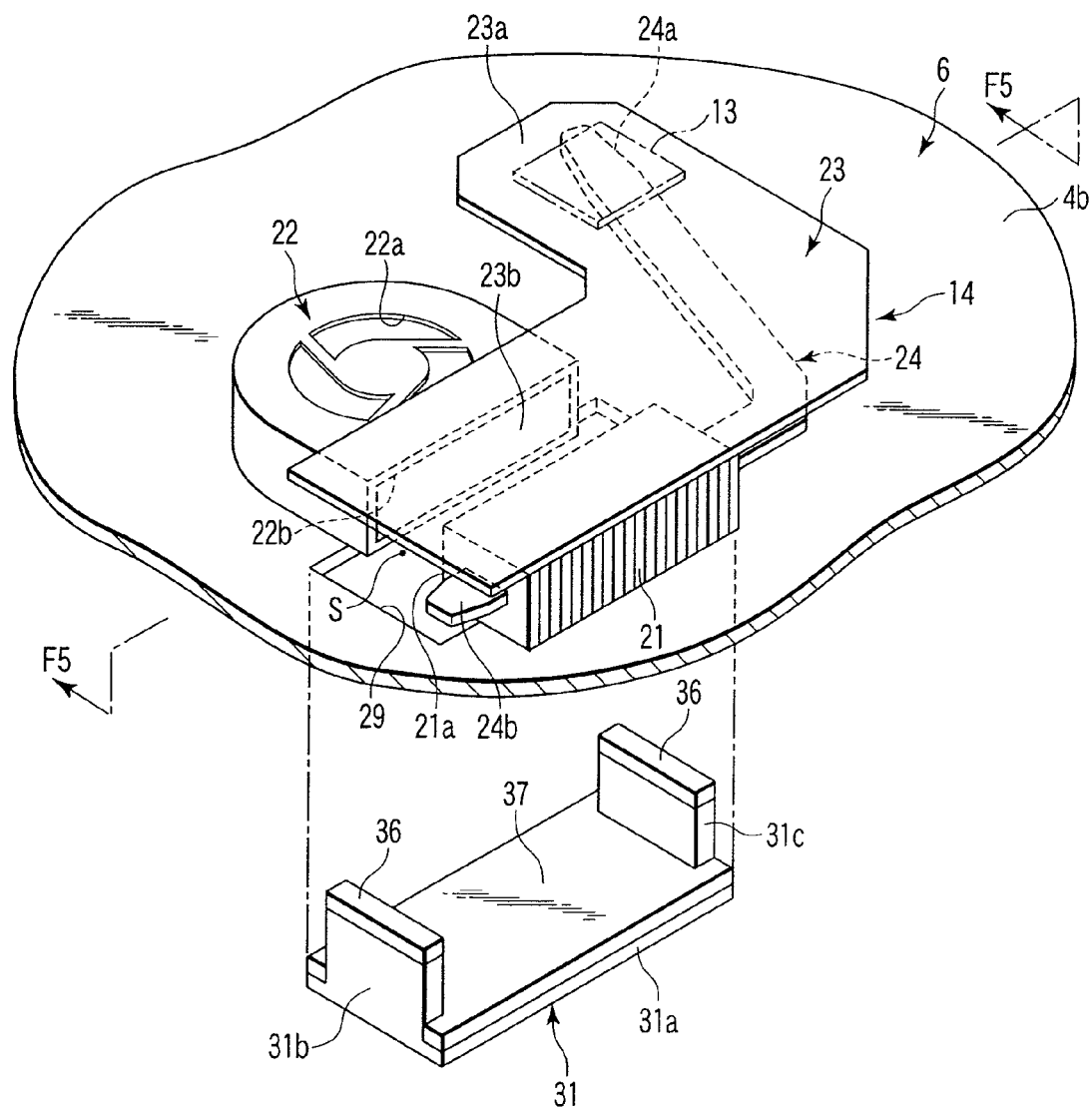
FIG. 3 is an exemplary perspective view showing the inside of the portable computer according to the first embodiment.

An example of the heat transfer member 24 may be a heat pipe. As shown in FIGS. 3 and 4, the heat transfer member 24 includes a heat receiving end 24a thermally connected to the heat receiving member 23, and a heat radiation end 24b thermally connected to the heat radiation fins 21. The heat transfer member 24 may be held in a floating fashion in the case 4. More specifically, studs 26 are mounted the circuit board 12, and a pressing member 27 is secured to the studs 26, while covering the heat receiving end 24a of the heat transfer member 24. The pressing member 27 is elastic and secured to the circuit board 12 with the aid of the studs 26, so that it presses the heat transfer member 24 against the heat generating component 13. When the heat transfer member 24 is pressed by the pressing member 27, the heat receiving member 23 is also pressed against the heat generating component 13 by the pressing member 27.

The heat radiation end 24b of the heat transfer member 24 passes through the heat radiation fins 21 in the direction crossing the exhausting direction of the cooling fan 22. The heat transfer member 24 receives heat at the heat receiving end 24a from the heat receiving member 23, and transfers the received heat to the heat radiation end 24b and to the heat radiation fins 21.

Figure 5:
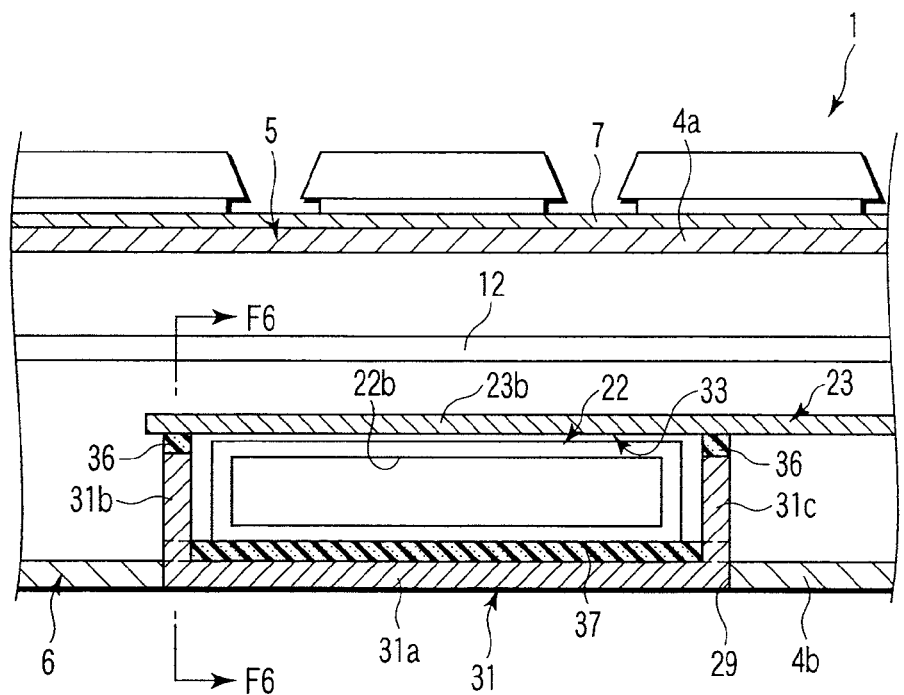
FIG. 5 is an exemplary cross-sectional view taken along the line F5-F5 in FIG. 3, the view showing another state of the portable computer shown in FIG. 3 when the lid member is attached to the computer.

The heat receiving member 23 is an example of case-contained member of the present invention. As shown in FIG. 3, the heat receiving member 23 includes a first area 23a and a second area 23b. The first area 23a is located under the heat generating component 13 and faces the component 13. The second area 23b extends from the first area 23a to above the heat radiation fins 21 and the cooling fan 22, and faces the space S which is present between the heat radiation fins 21 and the cooling fan 22 from above. Specifically, the second area 23b ranges from above the cooling fan 22 to above the heat radiation fins 21, while covering the space S. As shown in FIG. 5, the second area 23b extends in the direction orthogonal to the exhausting direction of the cooling fan 22 (i.e., horizontal direction in FIG. 5) and reaches an area out of the cooling fan 22.

Figure 2:
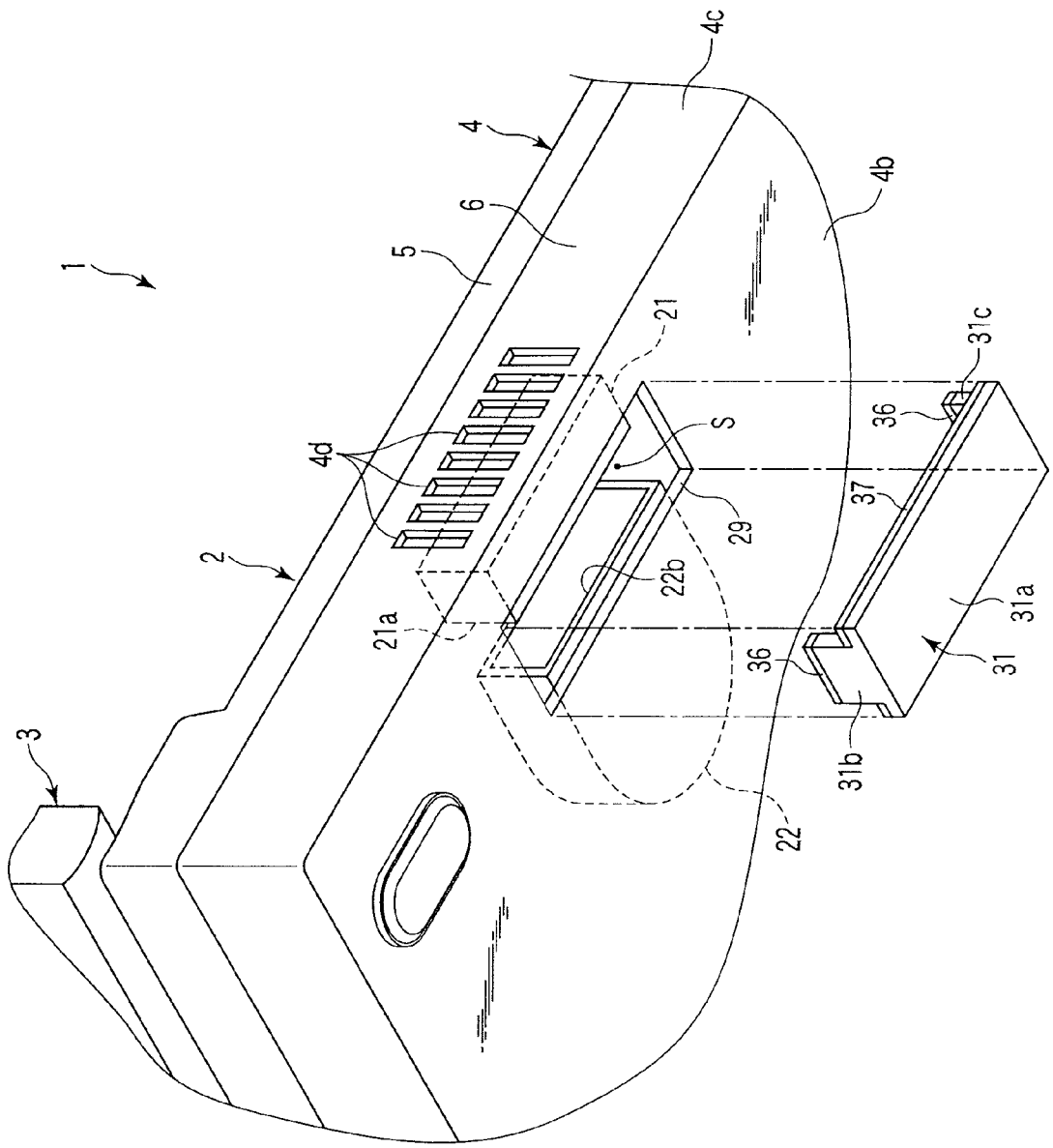
FIG. 2 is an exemplary perspective view showing the portable computer according to the first embodiment when viewed from the lower side.

As shown in FIGS. 2 and 3, an opening 29 is formed in the lower wall 4b of the case 4. As shown in FIG. 4, the opening 29 extends from below the heat radiation fins 21 to below the cooling fan 22, and faces the space S. As shown in FIG. 5, the opening 29 extends in the direction orthogonal to the exhausting direction of the cooling fan 22 and reaches a peripheral part out of the cooling fan 22 at both ends of the opening 29, respectively.

As shown in FIG. 2, a lid member 31 is detachably attached to the opening 29 of the case 4. The lid member 31 is fixed to the lower wall 4b by means of a screw or engagement. The lid member 31 is an example of a second member of the present invention. The case cover 5 and the case base 6 cooperate to form an example of a first member of the case of the present invention. The case 4 except the lid member 31 forms one form of a case body of the present invention.

Figure 6:
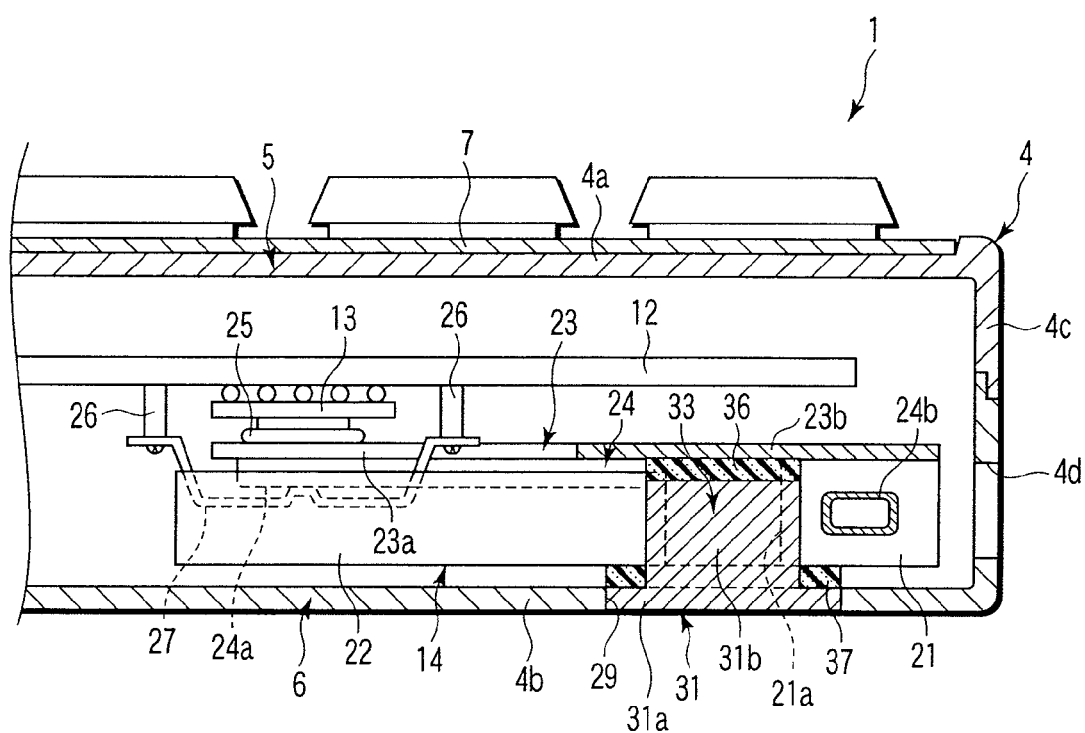
FIG. 6 is an exemplary cross-sectional view showing the portable computer, taken along the line F6-F6 in FIG. 5.

As shown in FIG. 3, the lid member 31 includes a cover part 31a and a pair of ribs 31b and 31c raised from the cover part 31a. The cover part 31a is formed to have a configuration substantially the same as that of the opening 29, and is detachably fit to the opening 29 to close the opening 29. As shown in FIG. 6, the cover part 31a attached to the opening 29 faces a part of the cooling fan 22 and a part of the heat radiation fins 21, and faces the space S. The cover part 31a faces the space S, on the side opposite to the heat receiving member 23, and cooperates with the heat receiving member 23 to define both sides of the space S.

As shown in FIGS. 3 and 5, the cover part 31a extends in the direction orthogonal to the exhausting direction of the cooling fan 22. The pair of ribs 31b and 31c are located at respective ends of the cover part 31a. The ribs 31b and 31c are spaced from each other to be wider than the lateral width of the cooling fan 22 (width as viewed in the lateral direction in FIG. 5). The ribs 31b and 31c extend toward the heat receiving member 23 from the cover part 31a. When the lid member 31 is attached to the opening 29, the ribs 31b and 31c stand upright on both sides of the space S, and place the space S between the ribs 31b and 31c. As shown in FIG. 6, the ribs 31b and 31c are opposed to a part of the cooling fan 22 and opposed to a part of the heat radiation fins 21.

When the lid member 31 is attached to the opening 29, the lid member 31 and the heat receiving member 23 cooperate to vertically and horizontally surround the space S. In other words, the lid member 31 and the heat receiving member 23 cooperate to form a duct 33 between the cooling fan 22 and the heat radiation fins 21. The duct 33 guides the air exhausted from the cooling fan 22 toward the heat radiation fins 21. Specifically, the heat receiving member 23 forms a part of the duct 33 and the lid member 31 forms the other part of the duct 33, and thus the members cooperate to form the duct structure. As shown in FIG. 6, the cooling fan 22 and the heat radiation fins 21 are partially inserted into the duct 33.

As shown in FIG. 3, first sponge members 36 are provided on the tip ends of the ribs 31b and 31c, respectively. A first sponge member 36 is an example of a flexible member. The flexible member, which may be used in the invention, is not limited to the sponge member, but may be a rubber member, for example. As shown in FIG. 5, when the lid member 31 is attached to the opening 29, the first sponge members 36 are interposed and compressingly held between the tip ends of the ribs 31b and 31c and the heat receiving member 23. As a result, it is substantially prevented that air leaks through the gap between the tip ends of the ribs 31b and 31c and the heat receiving member 23.

As shown in FIG. 3, a second sponge member 37 is provided on the upper surface, for example, its entire upper surface, of the cover part 31a, which is located out of the ribs 31b and 31c. The second sponge member 37 is an example of a flexible member. The flexible member, which may be used in the invention, is not limited to the sponge member, but may be a rubber member, for example. As shown in FIG. 6, when the lid member 31 is attached to the opening 29, the second sponge member 37 is interposed and compressingly held between the cover part 31a and the cooling fan 22 and between the cover part 31a and the heat radiation fins 21. As a result, it is substantially prevented that air leaks through the gaps between the cover part 31a and the cooling fan 22 and between the cover part 31a and the heat radiation fins 21.

Now, operation of the portable computer 1 will be described.

When the portable computer 1 is used for a long time, dust will be deposited on the surface 21a of the heat radiation fins 21, which faces the cooling fan 22. When the lid member 31 is removed from the lower wall 4b, the surface 21a of the heat radiation fins 21 which faces the cooling fan 22 is exposed to the outside of the case 4 through the opening 29. Thus, the user can access to and remove the dust deposited on the cooling fan 22 through the opening 29 without disassembling the portable computer 1.

When the lid member 31 is attached to the opening 29, the duct 33 is formed between the cooling fan 22 and the heat radiation fins 21, and the air exhausted from the cooling fan 22 is guided to the heat radiation fins 21 without leakage of the air.

In the portable computer 1 thus constructed, dust deposited on the heat radiation fins 21 can be removed, and the efficiency of the cooling by the cooling fan 22 is kept in satisfactory levels. More specifically, the space S is provided between the cooling fan 22 and the heat radiation fins 21 and the opening 29 is provided facing the space S. Accordingly, the surface 21a of the heat radiation fins 21 can be cleaned through the opening 29.

When the lid member 31 is attached to the opening 29, the lid member 31 and the heat receiving member 23 cooperate to form the duct 33 for guiding air from the cooling fan 22 to the heat radiation fins 21. Therefore, even when the space S is present between the cooling fan 22 and the heat radiation fins 21, the air exhausted from the cooling fan 22 is effectively used for the heat radiation fins 21 with little leakage of the air. With this, the cooling efficiency produced substantially is comparable with that in the case where the cooling fan 22 is located adjacent to the heat radiation fins 21.

Where a part of the duct 33 is formed with the heat receiving member 23, there is no need of mounting the parts specialized for forming the duct structure. When the duct structure is constructed with the lid member 31 and the heat receiving member 23 which are originally used for other purposes, as in the present embodiment, the number of parts of the portable computer 1 is reduced, the portable computer 1 is thinned, and the case structure is simplified. In other words, if the parts specialized for forming the duct structure are not used, the duct structure is provided without thickening the whole device.

It suffices that the lid member 31 includes at least the cover part 31a. When the lid member 31 includes the cover part 31a, the cover part 31a and the heat receiving member 23 vertically surround the space S. Therefore, the efficiency of the cooling by the cooling fan 22 is kept in satisfactory levels. When the lid member 31 includes the ribs 31b and 31c, the space S is vertically and horizontally surrounded, so that the efficiency of the cooling by the cooling fan 22 is kept in more satisfactory levels. If necessary, the ribs 31b and 31c may be provided on the heat receiving member 23.

Where the flexible materials such as the first sponge members 36 are interposed between the ribs 31b and 31c and the heat receiving member 23, the gaps between the ribs 31b and 31c and the heat receiving member 23 are closed to lessen the air leakage. The cooling efficiency of the cooling fan 22 is kept good.

When the heat transfer member 24 is floating held, i.e., the heat receiving member 23 is pressingly held by the pressing member 27, the height position of the heat receiving member 23 changes if the mounting height of the heat generating component 13 changes, for example, by replacing the heat generating component 13 with another heat generating component 13. Where the first sponge members 36, flexible, are attached to the ribs 31b and 31c, the first sponge members 36 deform as the heat receiving member 23 changes in height to close the gaps between the ribs 31b and 31c and the heat receiving member 23. In other words, the first sponge members 36 attached to the ribs 31b and 31c have the height adjusting function, so that the heat transfer member 24 may have the floating structure.

When the opening 29 is closed in an open-close fashion by the lid member 31, which is detachably attached to the opening 29 of the case 4, the heat radiation fins 21 can be cleaned without disassembling the case 4. This feature simplifies the cleaning work and makes it easy.

Figure 7:
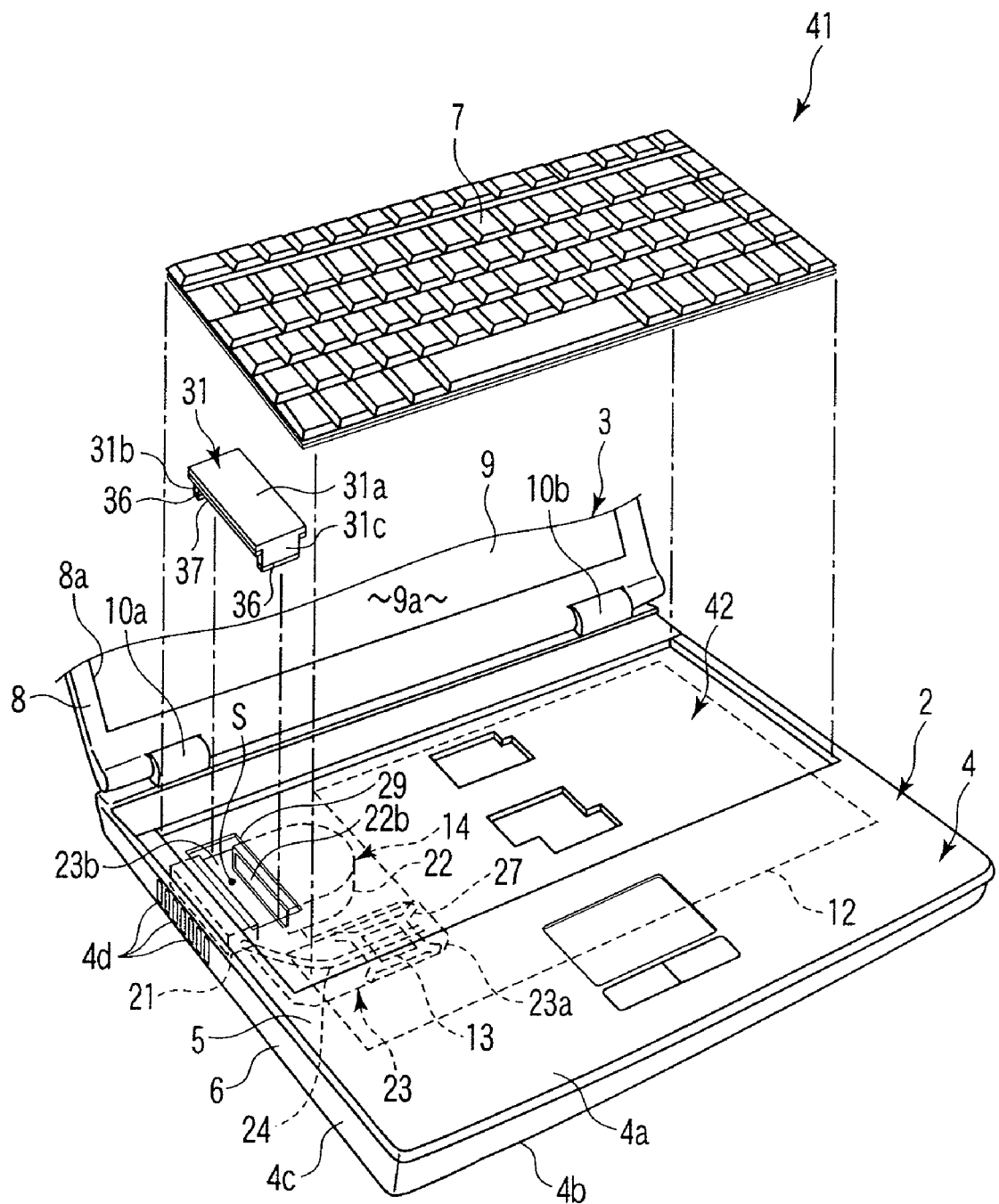
FIG. 7 is an exemplary perspective view showing a portable computer according to a second embodiment of the invention.

Next, a portable computer 41 as an electronic device according to a second embodiment of the invention will be described with reference to FIG. 7. Like or equivalent portions in the portable computer 1 of the first embodiment will be designated by like reference numerals, for simplicity. A basic configuration of a portable computer is the same as the first embodiment.

A keyboard placing part 42 to which the keyboard 7 is mounted is provided on the upper wall 4a of the portable computer 41. The keyboard placing part 42 has the opening 29 formed therein. The opening 29 faces the space S which is present between the heat radiation fins 21 and the cooling fan 22 from above. The surface 21a of the heat radiation fins 21, which faces the cooling fan 22, is exposed to the outside of the case 4 through the opening 29. The heat receiving member 23 faces the space S from the lower side. The lid member 31 having the cover part 31a and the ribs 31b and 31c is attached to the opening 29. The lid member 31 cooperates with the heat receiving member 23 to form the duct 33.

In the portable computer 41 including such a construction, the dust deposited on the heat radiation fins 21 may be removed for the same reason as in the portable computer 1 of the first embodiment. In addition, the cooling efficiency of the cooling fan 22 may be kept good.

Figure 8:
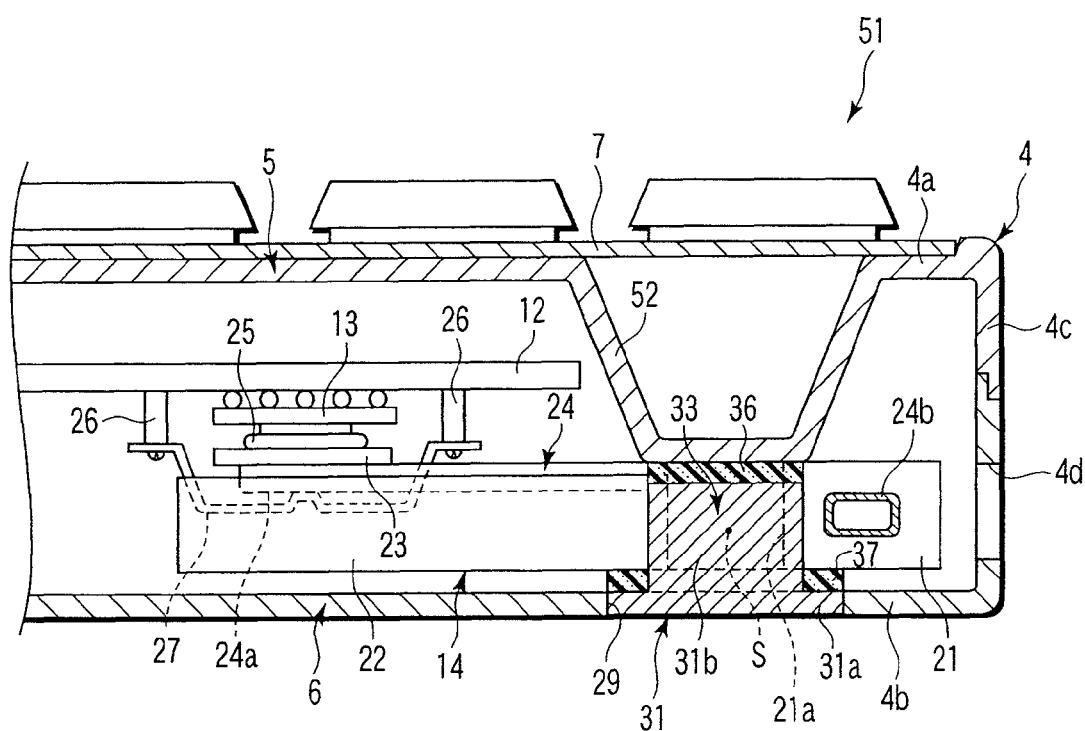
FIG. 8 is an exemplary cross-sectional view showing a portable computer according to a third embodiment of the invention.

A portable computer 51 as an electronic device according to a third embodiment of the invention will be described with reference to FIG. 8. Like or equivalent portions in the portable computers 1 and 41 of the first and second embodiments will be designated by like reference numerals, for simplicity. A basic configuration of a portable computer is the same as the first embodiment.

The case cover 5 of the portable computer 51 includes a recess 52 which curves toward the inner side of the case 4 and ranges from the upper side of the heat radiation fins 21 to the upper side of the cooling fan 22. The recess 52 faces the space S which is present between the heat radiation fins 21 and the cooling fan 22 from above. The recess 52 covers the upper side of the space S entirely in the direction orthogonal to the exhausting direction of the cooling fan 22, for example. In the embodiment, the case cover 5 and the case base 6 cooperate to form an example of a first member of the case of the present invention.

The lid member 31 takes an example of a second member of the case of the present invention. The lid member 31 is attached to the opening 29, and faces the space S on the side opposite to the case cover 5. The lid member 31 includes the cover part 31a and ribs 31b and 31c. The lid member 31 is detachably coupled to the recess 52 of the case cover 5. When the lid member 31 and the recess 52 are combined with each other, the lid member 31 and the recess 52 cooperate to form the duct 33.

In the portable computer 51 including such a constructed, the dust deposited on the heat radiation fins 21 may be removed and besides, the cooling efficiency of the cooling fan 22 may be kept good. Thus, since the space S is provided between the heat radiation fins 21 and the cooling fan 22, one may clean the heat radiation fins 21 through the opening 29. When the lid member 31 is attached to the opening 29, the duct 33 is formed between the cooling fan 22 and the heat radiation fins 21. Accordingly, the cooling efficiency of the cooling fan 22 is kept good.

When the duct 33 is formed with the case 4, there is no need of mounting the parts specialized for forming the duct structure. When the duct structure is constructed with the lid member 31 and the case cover 5 which are originally used for other purposes, as in the present embodiment, the number of parts of the portable computer 51 is reduced, the portable computer 51 is thinned, and the case structure is simplified. If required, it is allowed that the opening 29 to which the lid member 31 is attached is provided on the keyboard placing part 42 and the recess 52 is formed in the case base 6.

Figure 10:
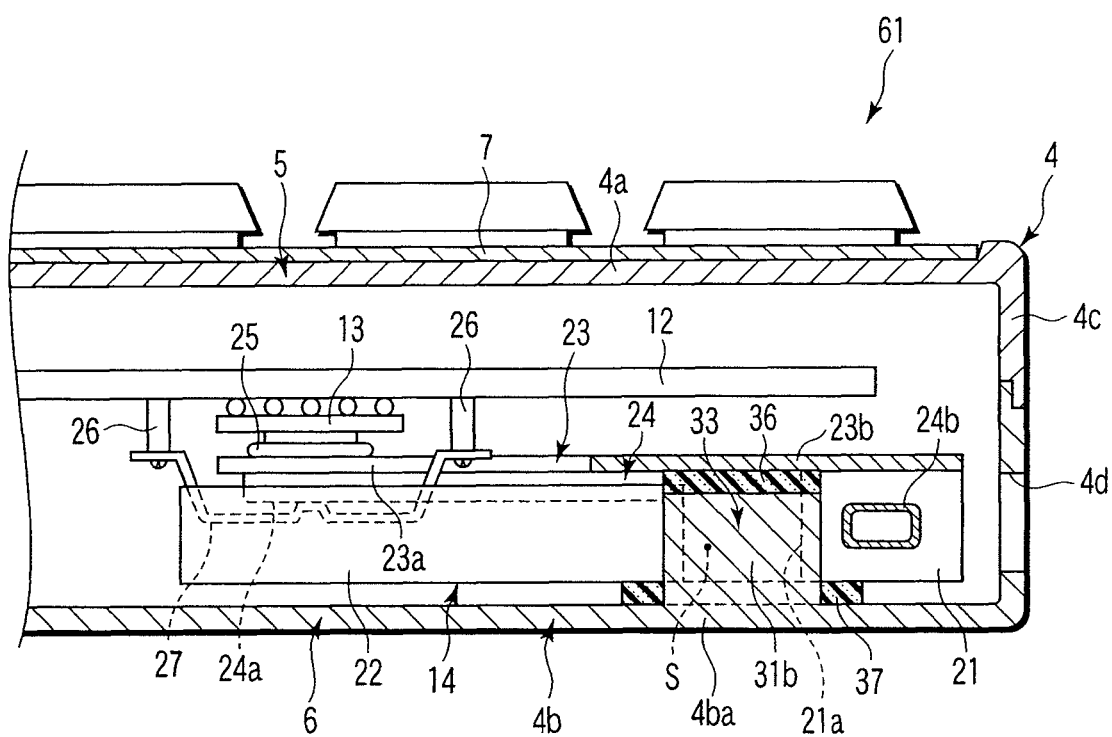
FIG. 10 is an exemplary cross-sectional view showing the portable computer of the fourth embodiment.

A portable computer 61 according to a fourth embodiment of the invention will be described with reference to FIGS. 9 and 10. Like or equivalent portions in the portable computer 1 of the first embodiment will be designated by like reference numerals, for simplicity. A basic configuration of a portable computer is the same as the first embodiment.

The lower wall 4b of the portable computer 61 includes an area be, which faces the space S which is present between the heat radiation fins 21 and the cooling fan 22 from the lower side. In the embodiment, the case cover 5 is an example of a first member of the present embodiment. The case base 6 is an example of a second member of the present invention, detachably coupled to the first member.

The pair of ribs 31b and 31c are provided integrally with the lower wall 4b in the area be of the lower wall 4b. When the portable computer 61 is assembled, the space S is vertically surrounded by the heat receiving member 23 and the lower wall 4b of the case 4, and the space S is horizontally surrounded by the ribs 31b and 31c. When the case base 6 is combined with the case cover 5, the case base 6 and the heat receiving member 23 cooperate to form the duct 33 between the heat radiation fins 21 and the cooling fan 22. The first sponge members 36 are provided on the tip ends of the ribs 31b and 31c, respectively. The second sponge member 37 is formed in the area be of the lower wall 4b.

In the portable computers 61 including such a construction, the dust deposited on the heat radiation fins 21 may be removed, and the cooling efficiency of the cooling fan 22 may be kept good. With provision of the space S between the heat radiation fins 21 and the cooling fan 22, the heat radiation fins 21 may be cleaned after the case base 6 is removed from the case cover 5. When the case base 6 is combined with the case cover 5, the duct 33 is formed between the cooling fan 22 and the heat radiation fins 21. Therefore, the cooling efficiency of the cooling fan 22 may be kept good.

Figure 11:
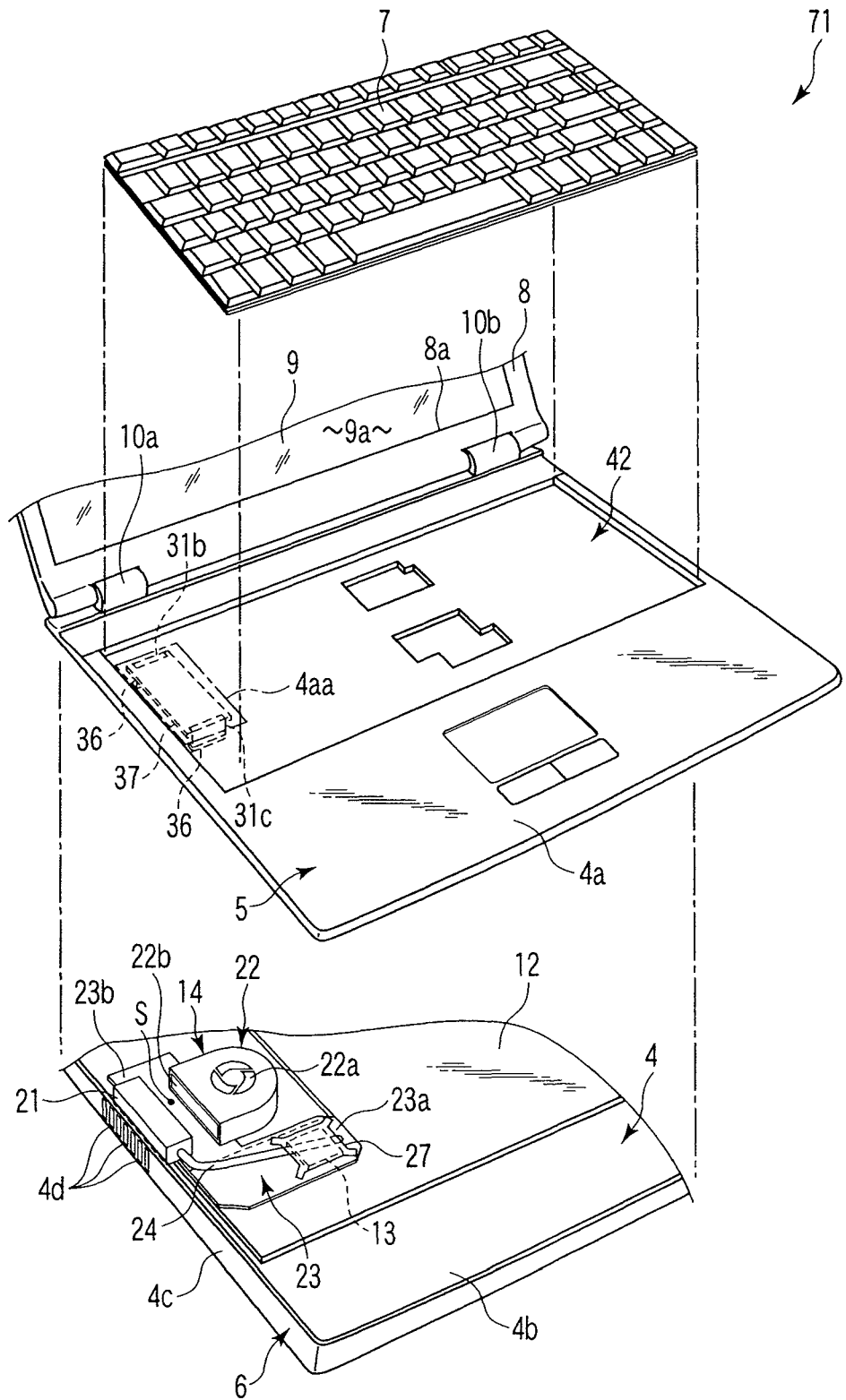
FIG. 11 is an exemplary exploded perspective view showing a portable computer according to a fifth embodiment of the invention.

A portable computer 71 as an electronic device according to a fifth embodiment of the invention will be described with reference to FIG. 11. Like or equivalent portions in the portable computers 1 and 41 of the first and second embodiments will be designated by like reference numerals, for simplicity. A basic configuration of a portable computer is the same as the first embodiment.

The upper wall 4a of the portable computer 71 includes an area Aar, which faces the space S which is present between the heat radiation fins 21 and the cooling fan 22 from above. In the embodiment, the case base 6 is an example of a first member of the case of the present invention, and the case cover 5 takes an example of a second member of the present invention, detachably coupled to the first member.

The pair of ribs 31b and 31c are provided integrally with the upper wall 4a in the area Aar of the upper wall 4a. When the portable computer 71 is assembled, the space S is vertically surrounded by the heat receiving member 23 and the upper wall 4a of the case 4, and the space S is horizontally surrounded by the ribs 31b and 31c. When the case cover 5 is combined with the case base 6, the case cover 5 and the heat receiving member 23 cooperate to form the duct 33 between the heat radiation fins 21 and the cooling fan 22. The first sponge members 36 are provided on the tip ends of the ribs 31b and 31c, respectively. The second sponge member 37 is provided on the area Aar of the upper wall 4a.

In the portable computer 71 including such a construction, like the portable computer 61 of the fourth embodiment, the dust deposited on the heat radiation fins 21 may be removed for cleaning, and the cooling efficiency of the cooling fan 22 may be kept good.

A portable computer 81 as an electronic device according to a sixth embodiment of the invention will be described with reference to FIGS. 12 to 17. Like or equivalent portions in the portable computer 1 of the first embodiment will be designated by like reference numerals, for simplicity. A basic configuration of a portable computer is the same as the first embodiment.

Figure 12:
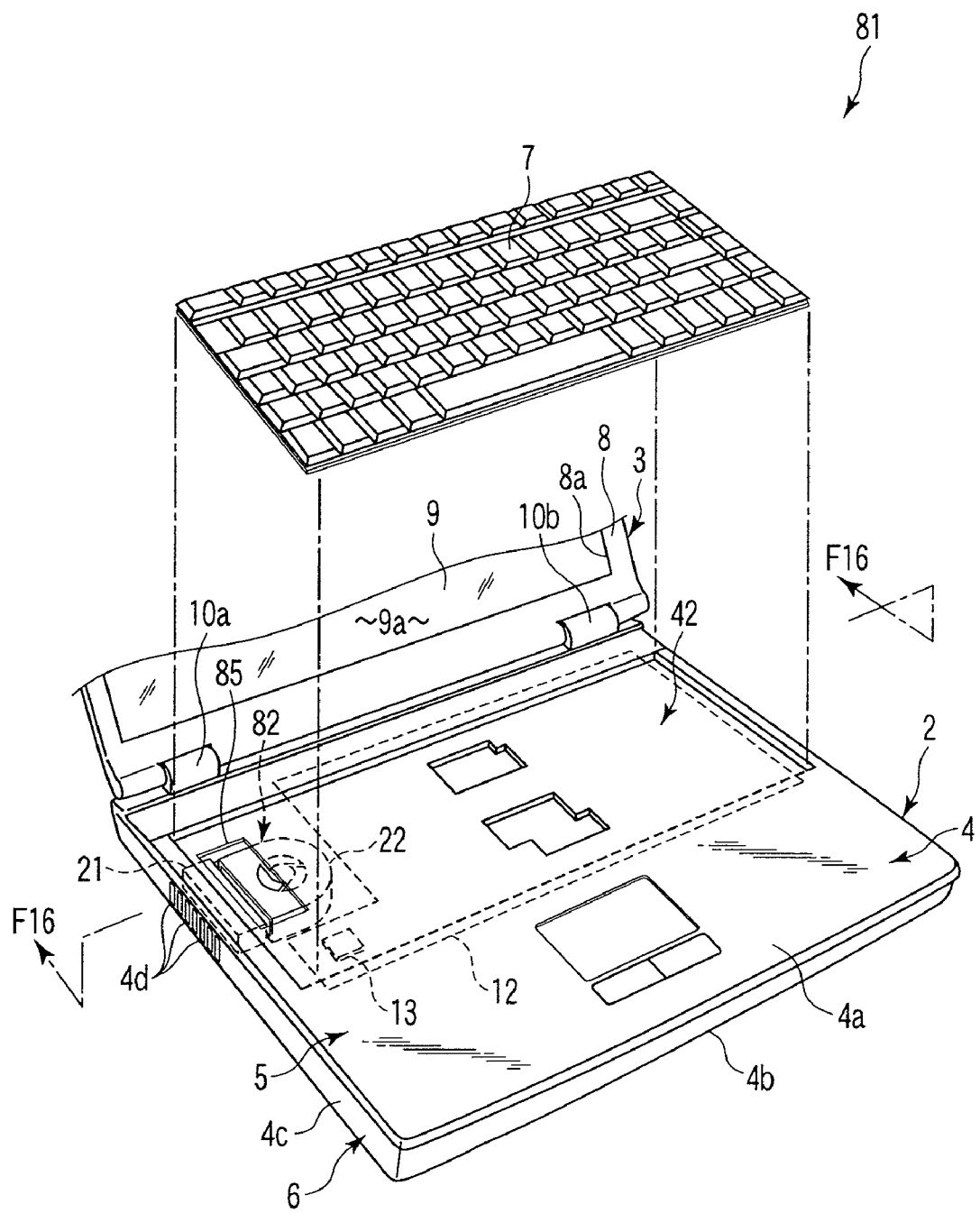
FIG. 12 is an exemplary perspective view showing a portable computer according to a sixth embodiment of the invention.
Figure 15:
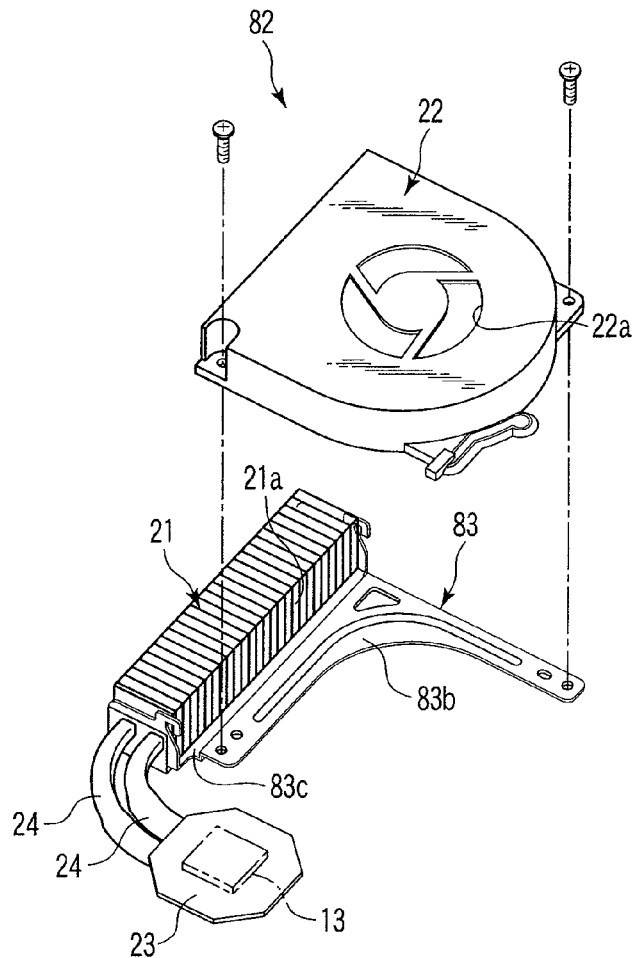
FIG. 15 is an exemplary exploded perspective view showing the heat radiation unit according to the six embodiment.
Figure 16:
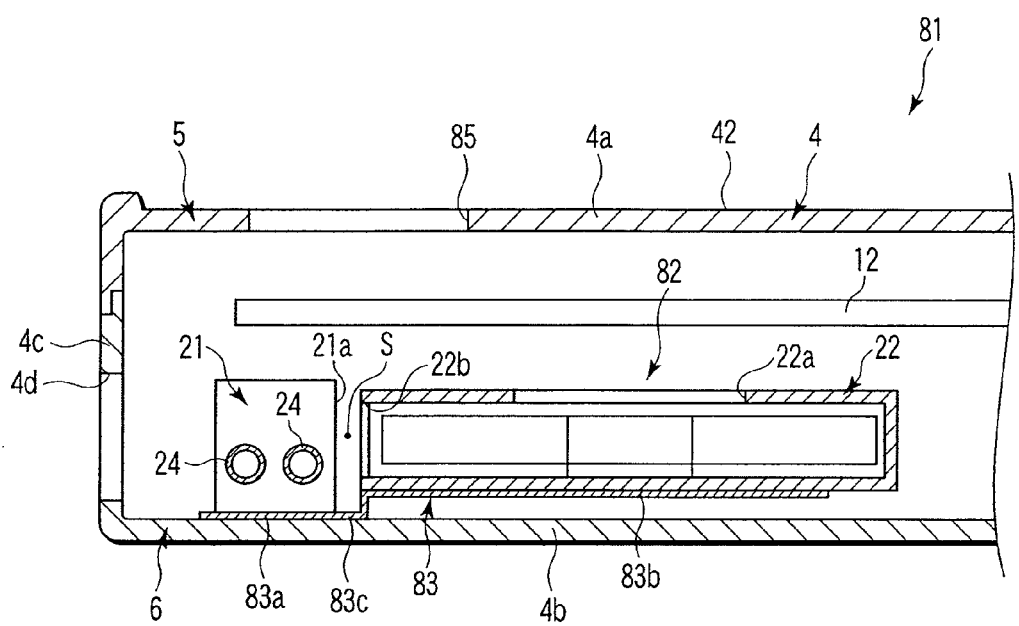
FIG. 16 is an exemplary cross-sectional view taken along the line F16-F16 in FIG. 12, showing a state of the portable computer when the duct member is removed from the portable computer.

As shown in FIG. 12, the case 4 contains a heat radiation unit 82. The heat radiation unit 82 includes the heat radiation fins 21, the cooling fan 22, the heat receiving member 23, and the heat transfer member 24. As shown in FIGS. 15 and 16, the heat radiation fins 21 and the cooling fan 22 are both fixed to a sheet metal member 83. The sheet metal member 83 includes a first area 83a for holding the heat radiation fins 21, and a second area 83b holding the cooling fan 22. In the sheet metal member 83, a third area 83c is provided between the first area 83a and the second area 83b. Accordingly, the cooling fan 22 attached to the second area 83b cooperates with the heat radiation fins 21 attached to the first area 83a to form the space S there between.

As shown in FIG. 13, a duct member 84 is detachably attached to the third area 83c of the sheet metal member 83. Specifically, the duct member 84 is arranged between the heat radiation fins 21 and the cooling fan 22. The duct member 84 has a configuration substantially the same as the surface 21a of the heat radiation fins 21, which faces the cooling fan 22. As shown in FIG. 14, the duct member 84 is shaped like a frame having a large opening 84a at the central part thereof.

Figure 17:
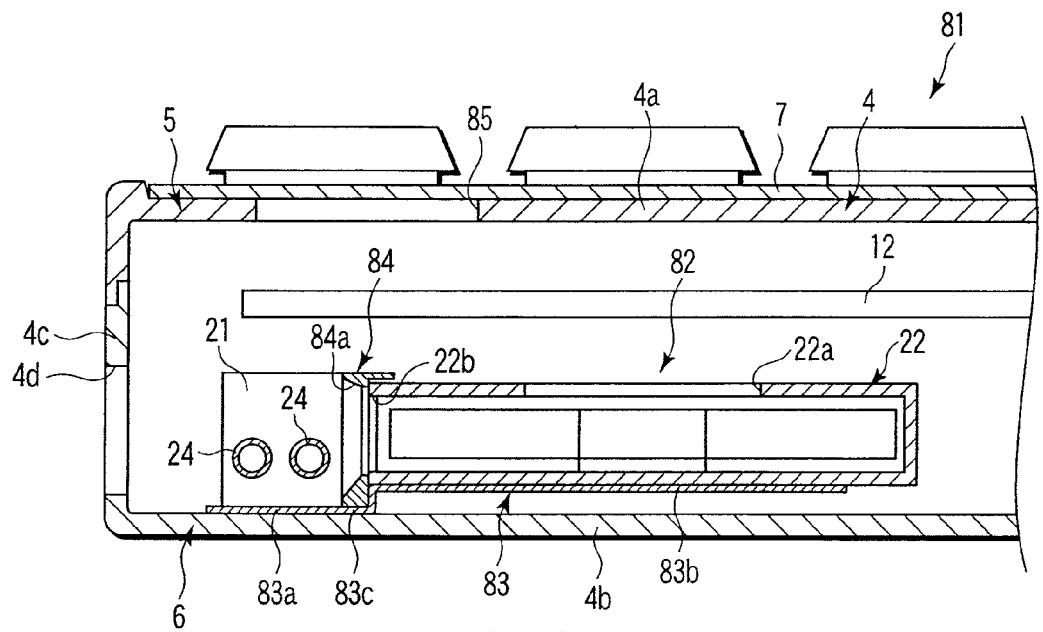
FIG. 17 is an exemplary cross-sectional view showing a state of the portable computer shown in FIG. 16 when the duct member is attached to the portable computer.

When as shown in FIG. 17, the duct member 84 is located between the heat radiation fins 21 and the cooling fan 22, the opening 84a of the duct member 84 faces the exhaust port 22b of the cooling fan 22 and the surface 21a of the heat radiation fins 21. The duct member 84 itself serves as a duct for guiding the air exhausted from the cooling fan 22 to the heat radiation fins 21.

As shown in FIG. 12, an opening 85 opened into the case 4 is formed in the keyboard placing part 42. The opening 85 faces the duct member 84 arranged between the heat radiation fins 21 and the cooling fan 22. The duct member 84 may be taken out to the outside of the case 4 through the opening 85.

Now, operation of the portable computer 81 will be described.

When the duct member 84 is removed, the surface 21a of the heat radiation fins 21, which faces the cooling fan 22, is exposed to the outside of the case 4 through the opening 85. Accordingly, dust on the heat radiation fins 21 can be cleaned through the opening 85 without disassembling the portable computer 81.

When the duct member 84 is attached between the heat radiation fins 21 and the cooling fan 22, a draft passage is formed between the cooling fan 22 and the heat radiation fins 21, and the air exhausted from the cooling fan 22 is guided to the heat radiation fins 21 practically without air leakage.

In the portable computer 81 including such a construction, the dust deposited on the heat radiation fins 21 may be removed for cleaning, and the cooling efficiency of the cooling fan 22 may be kept good. Since the space S is provided between the heat radiation fins 21 and the cooling fan 22, the heat radiation fins 21 may be cleaned through the opening 85. When the duct member 84 is attached between the heat radiation fins 21 and the cooling fan 22, a duct is formed between the cooling fan 22 and the heat radiation fins 21, so that the cooling efficiency of the cooling fan 22 is kept good.

When the duct member 84 is removable to the outside of the case 4 through the opening 84a, the heat radiation fins 21 may be cleaned without disassembling the case 4. This feature simplifies the cleaning work and makes it easy.

Figure 18:
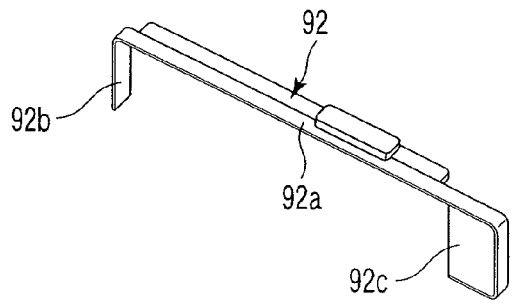
FIG. 18 is an exemplary perspective view showing a duct member according to a seventh embodiment of the invention.
Figure 19:
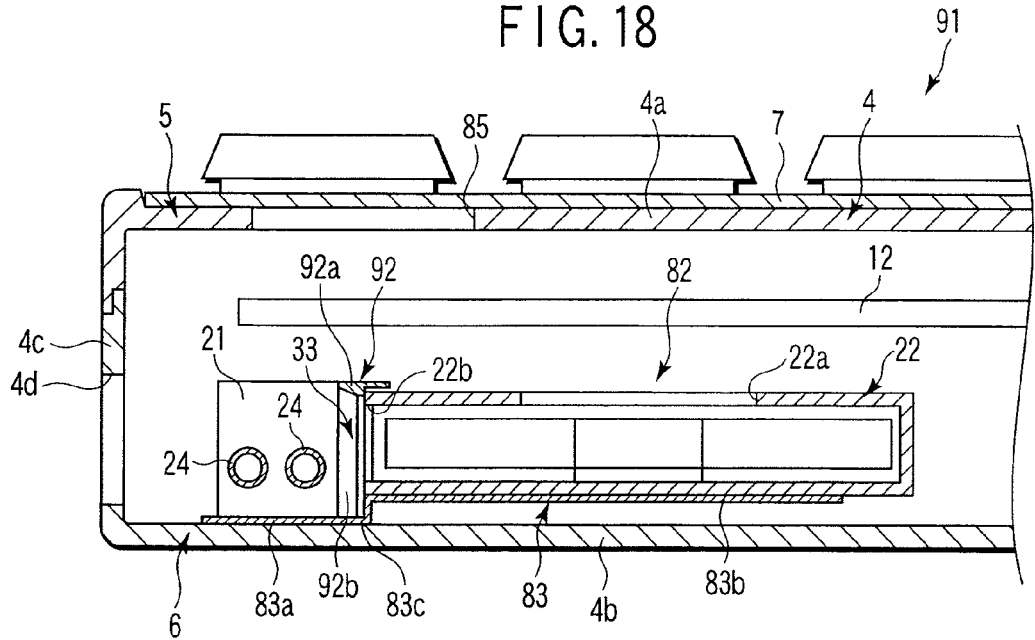
FIG. 19 is an exemplary cross-sectional view showing a portable computer according to the seventh embodiment.

A portable computer 91 as an electronic device according to a seventh embodiment of the invention will be described with reference to FIGS. 18 and 19. Like or equivalent portions in the portable computers 1 and 81 of the first and sixth embodiments will be designated by like reference numerals, for simplicity. A basic configuration of a portable computer is the same as the first embodiment.

A duct member 92 is detachably attached to the third area 83c of the sheet metal member 83. The duct member 92 includes a horizontal frame member 92a and a pair of vertical frame members 92b and 92c, which extend from both ends of the horizontal frame member 92a toward the sheet metal member 83. When the duct member 92 is arranged between the heat radiation fins 21 and the cooling fan 22, the space S which is present between the heat radiation fins 21 and the cooling fan 22 is vertically surrounded by the horizontal frame member 92a of the duct member 92 and the sheet metal member 83 and horizontally surrounded by the vertical frame members 92b and 92c of the duct member 92. Thus, the duct member 92 cooperates with the sheet metal member 83 to form the duct 33 for guiding the air exhausted from the cooling fan 22 to the heat radiation fins 21.

In the portable computer 91 including such a construction, the dust deposited on the heat radiation fins 21 may be removed for cleaning, and the cooling efficiency of the cooling fan 22 may be kept good. Since the space S is provided between the heat radiation fins 21 and the cooling fan 22, the heat radiation fins 21 may be cleaned through the opening 85. When the duct member 92 is arranged between the heat radiation fins 21 and the cooling fan 22, the duct member 92 cooperates with the sheet metal member 83 to form the duct 33 between the cooling fan 22 and the heat radiation fins 21, so that the cooling efficiency of the cooling fan 22 is kept good.

While the present invention has been described by using the portable computers 1, 4, 51, 61, 71, 81 and 91 according to the first to seventh embodiments, it should be understood that the invention is not limited to those portable computers. The components of the first to seventh embodiments may be appropriately combined.

With regard to a part of the duct 33 of each of the portable computers 61 and 71 according to the fourth and fifth embodiments, the heat receiving member 23 may be replaced with the recess 52 provided in the upper wall 4a or the lower wall 4b of the case 4. The first and second sponge members 36 and 37 according to the first to fifth embodiments are not essential to the present invention, and if required, those may be omitted. It is not essential that the ribs 31b and 31c extend to the heat receiving member 23. A gap may be present between the tip ends of the ribs 31b and 31c and the heat receiving member 23.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a case having a top portion and a bottom portion;
   heat radiation fins in the case, the heat radiation fins coupling to a bracket member in the case;
   a cooling fan in the case, the cooling fan being supported by the bracket member in a position relative to the heat radiation fins so as to exhaust air toward the heat radiation fins, the bracket member supporting the heat radiation fins and the cooling fan such that a space is present between them, and a duct member which is removably insertable through the top portion of the case to the space between the heat radiation fins and the cooling fan, the duct member guiding air exhausted from the cooling fan to the heat radiation fins.

2. The electronic device of claim 1, wherein the duct member is removable without opening the case.

3. The electronic device of claim 1, wherein the bracket member comprises a sheet-metal bracket.

4. The electronic device of claim 1, wherein the duct member independently forms an enclosed duct between the heat radiation fins and the cooling fan.

5. The electronic device of claim 4, wherein the duct member comprises a four-sided frame with a central opening.

6. The electronic device of claim 1, wherein the duct member forms an enclosed duct between the heat radiation fins and the cooling fan jointly in combination with the bracket member.

7. The electronic device of claim 1, wherein the duct member comprises a three-sided frame.

8. The electronic device of claim 1, wherein the electronic device comprises a notebook computer having a keyboard positioned over the top portion of the case, and wherein the duct member is configured to be inserted into an opening formed in the top portion of the case under the keyboard.

* * * * *